(12) United States Patent
Berggren

(10) Patent No.: US 7,542,445 B2
(45) Date of Patent: Jun. 2, 2009

(54) METHOD AND SYSTEM FOR MAINTAINING AUTONOMOUS SYSTEM CLOCK ACCURACY FOR A MOBILE RADIO TERMINAL

(75) Inventor: Lars I. Berggren, Malmö (SE)

(73) Assignee: Sony Ericsson Mobile Communications AB, Lund (SE)

( * ) Notice: Subject to any disclaimer, the term of this patent is extended or adjusted under 35 U.S.C. 154(b) by 520 days.

(21) Appl. No.: 11/423,965

(22) Filed: Jun. 14, 2006

(65) Prior Publication Data
US 2007/0291676 A1 Dec. 20, 2007

(51) Int. Cl.
H04Q 7/00 (2006.01)
(52) U.S. Cl. .................. 370/328; 455/255; 455/258
(58) Field of Classification Search .......... 370/328; 455/230, 231, 255, 258, 260
See application file for complete search history.

(56) References Cited

U.S. PATENT DOCUMENTS

| 4,932,072 | A |   | 6/1990 | Toko |
| 5,603,101 | A |   | 2/1997 | Choi |
| 6,026,133 | A | * | 2/2000 | Sokoler ............ 375/365 |
| 6,545,547 | B2 |  | 4/2003 | Fridi et al. |
| 6,697,645 | B1 |  | 2/2004 | MacFarlane |
| 6,753,737 | B2 |  | 6/2004 | Ho et al. |
| 7,009,460 | B2 |  | 3/2006 | Wilcox |
| 7,403,507 | B2 | * | 7/2008 | McDonough et al. ...... 370/335 |
| 2003/0064694 | A1 | * | 4/2003 | Oka et al. ............ 455/258 |
| 2003/0144020 | A1 | * | 7/2003 | Challa et al. ............ 455/522 |
| 2005/0079845 | A1 | * | 4/2005 | Ansorge et al. ............ 455/255 |
| 2005/0240789 | A1 |  | 10/2005 | Saito et al. |
| 2006/0017518 | A1 | * | 1/2006 | Wilcox ............ 331/185 |

FOREIGN PATENT DOCUMENTS

| JP | 10336067 | 12/1998 |
| JP | 2002217722 | 8/2002 |

OTHER PUBLICATIONS

Dallas Semiconductor, Using a VCXO (Voltage-Controlled Crystal Oscillator) as a Clock (CLK) Generator, 8 Pages, Jun. 2, 2003.
Silicon Laboratories, AN266, VCXO Tuning Slope (Kv), Stability, and Absolute Pull Range (APR), Rev. 0.1. Nov. 2005, 8 Pages, 2005.
AMI Semiconductor, PLL002, Programmable Phase Lock Loop, 4 Pages, 2002.
International Search Report from corresponding International Application No. PCT/IB2006/003522.

* cited by examiner

*Primary Examiner*—Cong Van Tran
(74) *Attorney, Agent, or Firm*—Renner, Otto, Boisselle & Sklar, LLP (57) ABSTRACT

A mobile radio terminal includes a system clock having a controller, a frequency generator for outputting a clock signal and a temperature sensor for detecting an operating temperature of the frequency generator. The controller adjusts a frequency of the clock signal by inputting a frequency generator control value associated with the detected operating temperature to the frequency generator. A control circuit that manages overall operation of the mobile radio terminal is configured to place the mobile radio in one of plural operational modes and the clock signal is used to clock an electrical component activated in connection with the one of the operational modes.

16 Claims, 3 Drawing Sheets

METHOD AND SYSTEM FOR MAINTAINING AUTONOMOUS SYSTEM CLOCK ACCURACY FOR A MOBILE RADIO TERMINAL

TECHNICAL FIELD OF THE INVENTION

The present invention relates generally to electronic equipment, such as a mobile radio terminal for engaging in voice communications. More particularly, the invention relates to a method and system for maintaining the accuracy of a system clock for the mobile radio terminal when the system clock functions autonomously (e.g., the system clock is not synchronized with a communications network).

DESCRIPTION OF THE RELATED ART

Mobile and/or wireless electronic devices are becoming increasingly popular. For example, mobile telephones and portable media players are now in wide-spread use. In addition, the features associated with certain types of electronic devices have become increasingly diverse. To name a few examples, many electronic devices have cameras, text messaging capability, Internet browsing functionality, electronic mail capability, video playback capability, audio playback capability, image display capability and hands-free headset interfaces.

Mobile devices that communicate with a communications network typically have a system clock that is synchronized with a reference clock of the communications network. Clock synchronization also may be referred to as frequency synchronization. Clock accuracy plays a role in the optimal functioning of various subsystems of many mobile devices, including placing and a receiving calls, interfacing with positioning systems (e.g., assisted GPS or A-GPS), interfacing with wireless local area networks (WLANs) and receiving mobile radio downstreams or mobile television downstreams such as under the digital video broadcasting—handheld (DVB-H) protocol.

In some situations, the mobile device may not be able to synchronize its system clock with the communications network's reference clock. One situation where synchronization may not be possible is when the mobile device is outside the coverage of the communications network. For example, if the mobile device were a cellular telephone, the system clock may not be synchronized with a cellular system reference clock if the phone were not in the cellular coverage area. In other situations, the mobile device may be placed in a "flight mode" (e.g., for use when aboard an aircraft), a "TV mode" or other mode where call functionality is not active and, hence, clock synchronization is not available.

When synchronization is not possible, the system clock of the mobile device may not be as accurate as desired. For instance, system clock behavior as a function of temperature and/or age may cause the clock to output a clock signal that has a less than optimum frequency.

SUMMARY

In view of the above, there exists a need in the art for a method and system to maintain the accuracy of a system clock for a mobile radio terminal when the system clock cannot be synchronized against a communications network clock or when it is preferable for the system clock to operate in an autonomous mode. Aspects of the present invention are directed to a method and system for maintaining the accuracy of a system clock for the mobile radio terminal in these situations.

According to one aspect of the invention, a mobile radio terminal includes a system clock having a controller, a frequency generator for outputting a clock signal and a temperature sensor for detecting an operating temperature of the frequency generator, wherein the controller adjusts a frequency of the clock signal by inputting a frequency generator control value associated with the detected operating temperature to the frequency generator; and a control circuit that manages overall operation of the mobile radio terminal, the control circuit configured to place the mobile radio in one of plural operational modes and the clock signal is used to clock an electrical component activated in connection with the one of the operational modes.

In one embodiment of the mobile radio terminal, the frequency generator is a voltage controlled crystal oscillator (VCXO).

In one embodiment of the mobile radio terminal, the frequency generator control value is input to a voltage controller of the frequency generator as a digital control signal and the voltage controller applies a corresponding analog voltage to a voltage control node of an oscillator of the frequency generator.

In one embodiment of the mobile radio terminal, the frequency generator does not include a phase locked loop (PLL) circuit.

In one embodiment of the mobile radio terminal, the mobile radio terminal further includes a radio circuit clocked with the clock signal, the radio circuit configured to establish communications with a communications network.

In one embodiment of the mobile radio terminal, the operational modes include at least one of a mobile television mode, a wireless network interface mode, a location determining mode or a mobile telephone flight mode.

In one embodiment of the mobile radio terminal, the mobile radio terminal further includes a look-up table that stores frequency generator control values for plural operating temperatures.

In one embodiment of the mobile radio terminal, the controller updates the look-up table in conjunction with a synchronization of the system clock with a reference signal from a communications network, the updating including changing a stored frequency generator control value for the operating temperature of the frequency generator at the time of synchronization to a control value applied to the frequency generator to establish synchronization of the system clock.

According to another aspect of the invention, a method of adjusting a frequency of a clock signal generated by a system clock of a mobile radio terminal where the system clock has a frequency generator includes determining an operating temperature of the frequency generator; identifying a frequency generator control value associated with the determined temperature; applying the control value to the frequency generator to control the frequency generator to output the clock signal with a target frequency; and placing the mobile radio terminal in one of plural operational modes and clocking an electrical component activated in connection with the one of the operational modes with the clock signal.

In one embodiment of the method, the frequency generator is a voltage controlled crystal oscillator (VCXO).

In one embodiment of the method, the frequency generator control value is input to a voltage controller of the frequency generator as a digital control signal and the voltage controller applies a corresponding analog voltage to a voltage control node of an oscillator of the frequency generator.

In one embodiment of the method, the frequency generator does not include a phase locked loop (PLL) circuit.

In one embodiment of the method, the method further includes clocking at least one of a radio circuit or a control circuit of the mobile telephone with the clock signal.

In one embodiment of the method, the operational modes include at least one of a mobile television mode, a wireless network interface mode, a location determining mode or a mobile telephone flight mode.

In one embodiment of the method, identifying the frequency generator control value associated with the determined temperature includes retrieving the frequency generator control value from a look-up table that stores frequency generator control values for plural operating temperatures.

In one embodiment of the method, the method further includes synchronizing the system clock with a reference signal from a communications network; and in conjunction with the synchronizing, updating the look-up table by changing a stored frequency generator control value for the operating temperature of the frequency generator at the time of synchronization to a control value applied to the frequency generator to establish synchronization of the system clock.

According to yet another aspect of the invention, a method of adjusting a frequency of a clock signal generated by a system clock of a mobile radio terminal where the system clock has a frequency generator includes determining if a synchronization function to synchronize the system clock with a reference signal provided by a communications network is available and, if so, synchronizing the system clock with the reference signal from the communications network; and updating a look-up table that stores frequency generator control values for plural operating temperatures of the frequency generator by changing a stored frequency generator control value for the operating temperature of the frequency generator at the time of synchronization to a control value applied to the frequency generator to establish synchronization of the system clock. If the synchronization function is not available, then the method controls the system clock by determining an operating temperature of the frequency generator; retrieving a previously stored frequency generator control value associated with the determined temperature from the look-up table; and applying the control value to the frequency generator to control the frequency generator to output the clock signal with a target frequency.

In one embodiment of the method, the frequency generator is a voltage controlled crystal oscillator (VCXO).

In one embodiment of the method, the frequency generator control value is input to a voltage controller of the frequency generator as a digital control signal and the voltage controller applies a corresponding analog voltage to a voltage control node of an oscillator of the frequency generator.

In one embodiment of the method, the method further includes placing the mobile radio terminal in one of plural operational modes and clocking an electrical component activated in connection with the one of the operational modes with the clock signal.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended hereto.

Features that are described and/or illustrated with respect to one embodiment may be used in the same way or in a similar way in one or more other embodiments and/or in combination with or instead of the features of the other embodiments.

It should be emphasized that the term "comprises/comprising" when used in this specification is taken to specify the presence of stated features, integers, steps or components but does not preclude the presence or addition of one or more other features, integers, steps, components or groups thereof.

DETAILED DESCRIPTION OF EMBODIMENTS

The present invention will now be described with reference to the drawings, wherein like reference numerals are used to refer to like elements throughout. It will be understood that the figures are not necessarily to scale.

The term "electronic equipment" includes portable radio communication equipment. The term "portable radio communication equipment," which herein after is referred to as a "mobile radio terminal," includes all equipment such as mobile telephones, pagers, communicators, electronic organizers, personal digital assistants (PDAs), smartphones, portable communication apparatus or the like.

In the present application, the invention is described primarily in the context of a mobile telephone. However, it will be appreciated that the invention is not intended to be limited to a mobile telephone and can be any type of electronic equipment. Also, embodiments of the invention are described primarily in the context of maintaining system clock accuracy when synchronization of the system clock to a reference clock from a communications network is not available. It will be appreciated that the frequency of the system clock may be maintained in the manner described herein for certain operational modes of the mobile telephone, even when synchronization is available. Those operational modes may include, for example, a mobile radio mode or mobile television mode (e.g., to receive and process a time-sliced data downstream, such as a DVB-H broadcast), a networking mode (e.g., to interface to a WLAN), a location determination mode (e.g., a GPS mode), a flight mode, and so forth.

Figure 1:
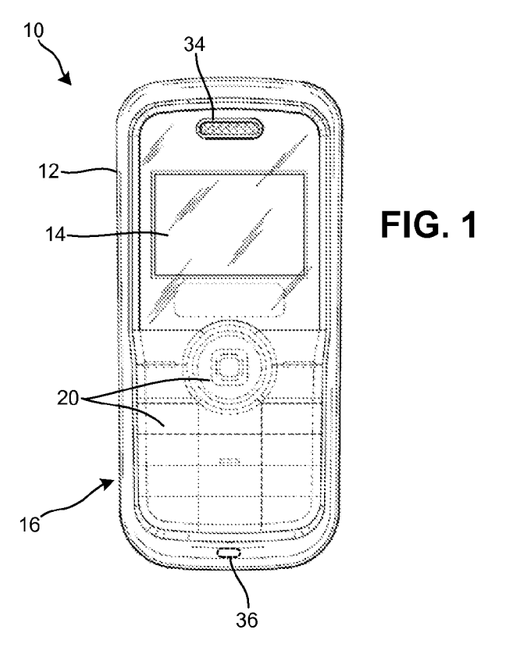
FIG. 1 is a schematic view of a mobile telephone as an exemplary electronic equipment in accordance with an embodiment of the present invention.

Referring initially to FIG. 1, an electronic equipment 10 is shown in accordance with the present invention. The electronic equipment 10 includes a tunable system clock that provides a clock signal. The clock signal may be used by the electronic equipment to operate according to a particular communication standard, such as global system for mobile communications (GSM), universal mobile telecommunications system (UMTS), code divisional multiple access (CDMA), advanced versions of these standards, or any other appropriate standard. The clock signal may also serve as a clock source for various components of the electronic equipment 10, such as a processor, an application specific integrated circuit (ASIC), etc.

The electronic equipment shown in the illustrated embodiments is a mobile telephone and will be referred to as the mobile telephone 10. The mobile telephone 10 is shown as having a "brick" or "block" form factor housing 12, but it will be appreciated that other type housings, such as a clamshell housing or a slide-type housing, may be utilized.

The mobile telephone 10 includes a display 14 and keypad 16. As is conventional, the display 14 may be used to display information to a user such as operating state, time, telephone numbers, contact information, various navigational menus, etc., which enable the user to utilize the various feature of the mobile telephone 10. The display 14 may also be used to visually display content received by the mobile telephone 10 and/or retrieved from a memory 18 (FIG. 2) of the mobile telephone 10.

Similarly, the keypad 16 may be conventional in that it provides for a variety of user input operations. For example, the keypad 16 typically includes alphanumeric keys 20 for allowing entry of alphanumeric information such as telephone numbers, phone lists, contact information, notes, messages, etc. In addition, the keypad 16 typically includes special function keys such as a "call send" key for initiating or answering a call, and a "call end" key for ending or "hanging up" a call. Special function keys may also include menu navigation keys, for example, for navigating through a menu displayed on the display 14 to select different telephone functions, profiles, settings, etc., as is conventional. Other keys associated with the mobile telephone may include a volume key, an audio mute key, an on/off power key, a web browser launch key, a camera key, etc. Keys or key-like functionality may also be embodied as a touch screen associated with the display 14.

The mobile telephone 10 includes conventional call circuitry that enables the mobile telephone 10 to establish a call and/or exchange signals with a called/calling device, typically another mobile telephone or landline telephone. However, the called/calling device need not be another telephone, but may be some other device such as an Internet web server, content providing server, etc.

Figure 2:
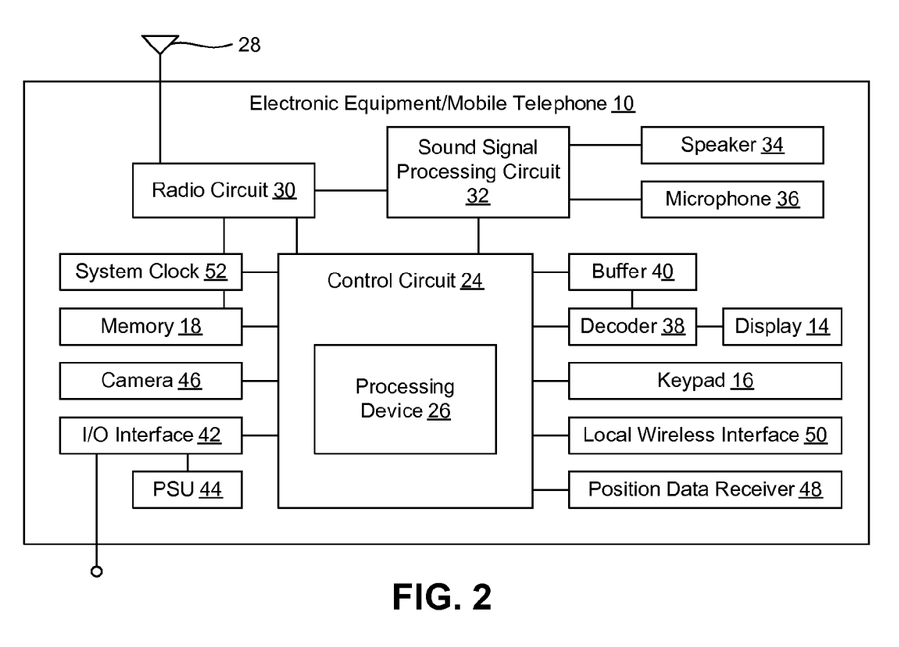
FIG. 2 is a schematic block diagram of the relevant portions of the mobile telephone of FIG. 1 in accordance with an embodiment of the present invention.

FIG. 2 represents a functional block diagram of the mobile telephone 10. For the sake of brevity, generally conventional features of the mobile telephone 10 will not be described in great detail herein. The mobile telephone 10 includes a primary control circuit 24 that is configured to carry out overall control of the functions and operations of the mobile telephone 10. The control circuit 24 may include a processing device 26, such as a CPU, microcontroller or microprocessor. The processing device 26 executes logical instructions to perform various functions of the mobile telephone 10. The logical instructions may be stored in the form of code in a memory (not shown) within the control circuit 24 and/or in a separate memory, such as memory 18. The memory 18 may be, for example, one or more of a buffer, a flash memory, a hard drive, a removable media, a volatile memory, a non-volatile memory or other suitable device. It will be apparent to a person having ordinary skill in the art of computer programming, and specifically in applications programming for mobile telephones or other electronic devices, how to program a mobile telephone 10 to operate and carry out the various functions described herein. Accordingly, details as to specific programming code have been left out for the sake of brevity. Also, while various functions may be executed by the processing device 26 in accordance with the preferred embodiment of the invention, such functionality could also be carried out via dedicated hardware, firmware, software, or combinations thereof.

Continuing to refer to FIGS. 1 and 2, the mobile telephone 10 includes an antenna 28 coupled to a radio circuit 30. The radio circuit 30 includes a radio frequency transmitter and receiver for transmitting and receiving signals via the antenna 28 as is conventional. The radio circuit 30 may be configured to operate in a mobile communications system, as well as to receive data and/or audiovisual content. For example, the receiver may be an IP datacast compatible receiver compatible with a hybrid network structure providing mobile communications and digital broadcast services, such as DVB-H mobile television and/or mobile radio. Other receivers for interaction with a mobile radio network or broadcasting network are possible and include, for example, GSM, CDMA, WCDMA, MBMS, WiFi, WiMax, ISDB-T, etc.

The mobile telephone 10 further includes a sound signal processing circuit 32 for processing audio signals transmitted by/received from the radio circuit 30. Coupled to the sound processing circuit 32 are a speaker 34 and a microphone 36 that enable a user to listen and speak via the mobile telephone 10 as is conventional. The radio circuit 30 and sound processing circuit 32 are each coupled to the control circuit 24 so as to carry out overall operation. Audio data may be passed from the control circuit 24 to the sound signal processing circuit 32 for playback to the user. The audio data may include, for example, audio data from an audio file stored by the memory 18 and retrieved by the control circuit 24. The sound processing circuit 32 may include any appropriate buffers, decoders, amplifiers and so forth.

The mobile telephone 10 also includes the aforementioned display 14 and keypad 16 coupled to the control circuit 24. The display 14 may be coupled to the control circuit 24 by a video decoder 38 that converts video data to a video signal used to drive the display 14. The video data may be generated by the control circuit 24, retrieved from a video file that is stored in the memory 18, derived from an incoming video data stream received by the radio circuit 30 or obtained by any other suitable method. Prior to being fed to the decoder 38, the video data may be buffered in a buffer 40.

The mobile telephone 10 further includes one or more I/O interface(s) 42. The I/O interface(s) 42 may be in the form of typical mobile telephone I/O interfaces and may include one or more electrical connectors. As is typical, the I/O interface (s) 42 may be used to couple the mobile telephone 10 to a battery charger to charge a battery of a power supply unit (PSU) 44 within the mobile telephone 10. In addition, or in the alternative, the I/O interface(s) 42 may serve to connect the mobile telephone 10 to a wired personal hands-free adaptor (not shown), such as a headset (sometimes referred to as an earset) to audibly output sound signals output by the sound processing circuit 32 to the user. Further, the I/O interface(s) 42 may serve to connect the mobile telephone 10 to a personal computer or other device via a data cable. The mobile telephone 10 may receive operating power via the I/O interface(s) 42 when connected to a vehicle power adapter or an electricity outlet power adapter.

The mobile telephone 10 may include a camera 46 for taking digital pictures and/or movies. Image and/or video files corresponding to the pictures and/or movies may be stored in the memory 18. The mobile telephone 10 also may include a position data receiver 48, such as a global positioning system (GPS) receiver, Galileo satellite system receiver or the like. The mobile telephone 10 also may include a local wireless interface 50, such as an infrared transceiver and/or an RF adaptor (e.g., a Bluetooth adapter), for establishing communication with an accessory, a hands-free adaptor (e.g., a headset that may audibly output sounds corresponding to audio data transferred from the mobile telephone 10 to the adapter), another mobile radio terminal, a computer or another device.

The mobile telephone 10 may be configured to transmit, receive and process data, such as text messages (e.g., colloquially referred to by some as "an SMS"), electronic mail messages, multimedia messages (e.g., colloquially referred to by some as "an MMS"), image files, video files, audio files, ring tones, streaming audio, streaming video, data feeds (including podcasts) and so forth. Processing such data may include storing the data in the memory 18, executing applications to allow user interaction with data, displaying video and/or image content associated with the data, outputting audio sounds associated with the data and so forth.

As indicated, the mobile telephone 10 may include a system clock 52. The system clock 52 may be configured to output a clock signal that is used by the radio circuit 30, the control circuit 24 and/or other electronic components of the mobile telephone 10. The system clock 52 may include any appropriate frequency generator, such as a phase lock oscillator (PLO), a voltage controlled oscillator (VCO) and/or a voltage controlled crystal oscillator (VCXO) with or without a phase lock loop (PLL) circuit. In the embodiments described herein, the frequency generator is a VCXO without a PLL. A VCXO is a crystal controlled oscillator that varies the frequency of the output signal in direct proportion to an applied control voltage. A suitable VCXO is described in commonly assigned U.S. Pat. No. 7,009,460, which is incorporated herein by reference in its entirety. While the illustrated embodiments are described in terms of a VCXO, those skilled in the art will appreciate that the principles described herein may be applied to other frequency generators.

Figure 3:
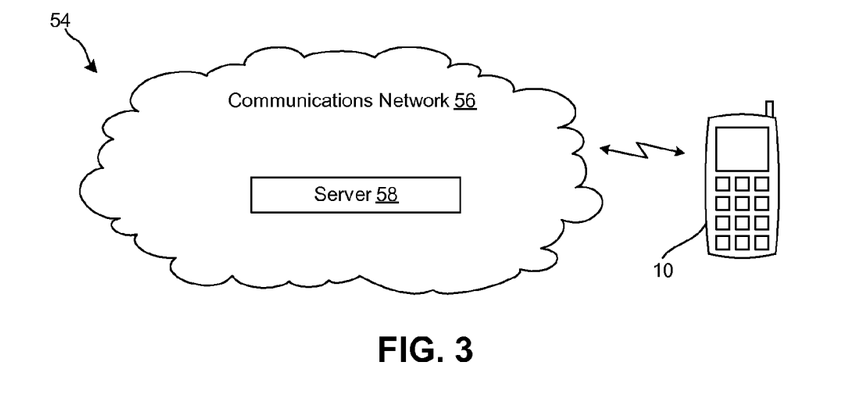
FIG. 3 is a schematic diagram of a communications system in which the mobile telephone of FIG. 1 may operate.

With additional reference to FIG. 3, the mobile telephone 10 may be configured to operate as part of a communications system 54. The system 54 may include a communications network 56 having a server 58 (or servers) for managing calls placed by and destined to the mobile telephone 10, transmitting data to the mobile telephone 10 and carrying out any other support functions. The server communicates with the mobile telephone 10 via a transmission medium. The transmission medium may be any appropriate device or assembly, including, for example, a communications tower, another mobile telephone, a wireless access point, a satellite, etc. Portions of the network may include wireless transmission pathways. The network 56 may support the communications activity of multiple mobile telephones 10, although only one mobile telephone 10 is shown in the illustration of FIG. 3.

In one embodiment, the server 58 may operate in stand alone configuration relative to other servers of the network 52 or may be configured to carry out multiple communications network 58 functions. As will be appreciated, the server 58 may be configured as a typical computer system used to carry out server functions and may include a processor configured to execute software containing logical instructions that embody the functions of the server 58.

Figure 4:
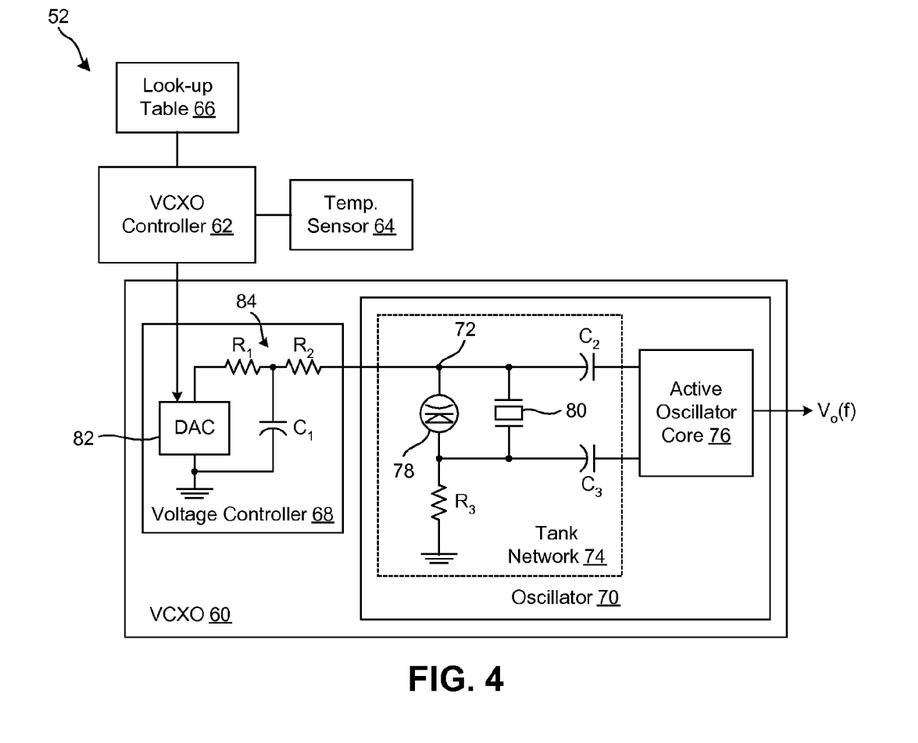
FIG. 4 is a block diagram of a system clock for the mobile telephone in accordance with an embodiment of the present invention.

FIG. 4 illustrates a block diagram of an exemplary system clock 52. The exemplary system clock 52 includes a VCXO 60, a VCXO controller 62, a temperature sensor 64 and a look-up table 66. The VCXO 60 may include a voltage controller 68 and an oscillator 70. The voltage controller 68 applies a variable voltage to an oscillator input node 72 so that the oscillator 70 may generate the clock signal (or oscillator output signal Vo(f)) that oscillates at a desired frequency. The controller 62 inputs a digital control signal to the voltage controller 68, which converts the control signal to the voltage input signal applied to the oscillator 70. As will be described in greater detail below, at certain times the control signal output by the controller 62 may be based on a sensed temperature as determined by the temperature sensor 64 and a value extracted from a look-up table 66. In one embodiment, the look-up table 66 may be stored by the memory 18, which may be accessed by the VCXO controller 62 via the control circuit 24. In one embodiment, some or all of the functions of the VCXO controller 62 may be carried out by the control circuit 24, in which case the controller 62 may be implemented by the control circuit 24. The VCXO 60 may further include a start-up controller (not illustrated) that assists in bringing the oscillator 70 to a steady state so as to activate the various electronic components of the mobile telephone 10 when the mobile telephone 10 is started-up and before an attempt to synchronize the oscillator 70 output with a communications network 56 reference clock has been made.

The VCXO 60 shown in FIG. 4 is a representative implementation, and the system clock 52 may vary from that which is depicted. In this exemplary embodiment, the oscillator 70 includes a tank network 74 and an active oscillator core 76. The tank network 74 includes a variable capacitor network, including varactor diode 78 and a crystal resonator 80 that sets the output frequency generated by oscillator 70 based on the magnitude of the voltage input signal applied to the varactor diode 78 at node 72. In general, the tank network 78 is a feedback circuit for the active oscillator core 76 that shifts the output frequency generated by oscillator 70 in response to the sour voltage input signal.

The voltage controller 68 includes a digital-to-analog converter (DAC) 82 connected to an impedance network 84 defined in the illustrated example by resistors $R_1$ and $R_2$ and capacitor $C_1$. The DAC 82 converts the digital control signal received from the controller 62 into an analog DC voltage. The digital control signal may be, for example, a hexadecimal command word between 000 and 3FF, where 000 corresponds to a minimum source voltage, e.g., 0.3 V, and 3FF corresponds to a maximum source voltage, e.g., 2.6 V. Thus, the digital control signal drives the voltage input signal so as to enable the oscillator 70 to generate a clock signal having a particular frequency.

Figure 5:
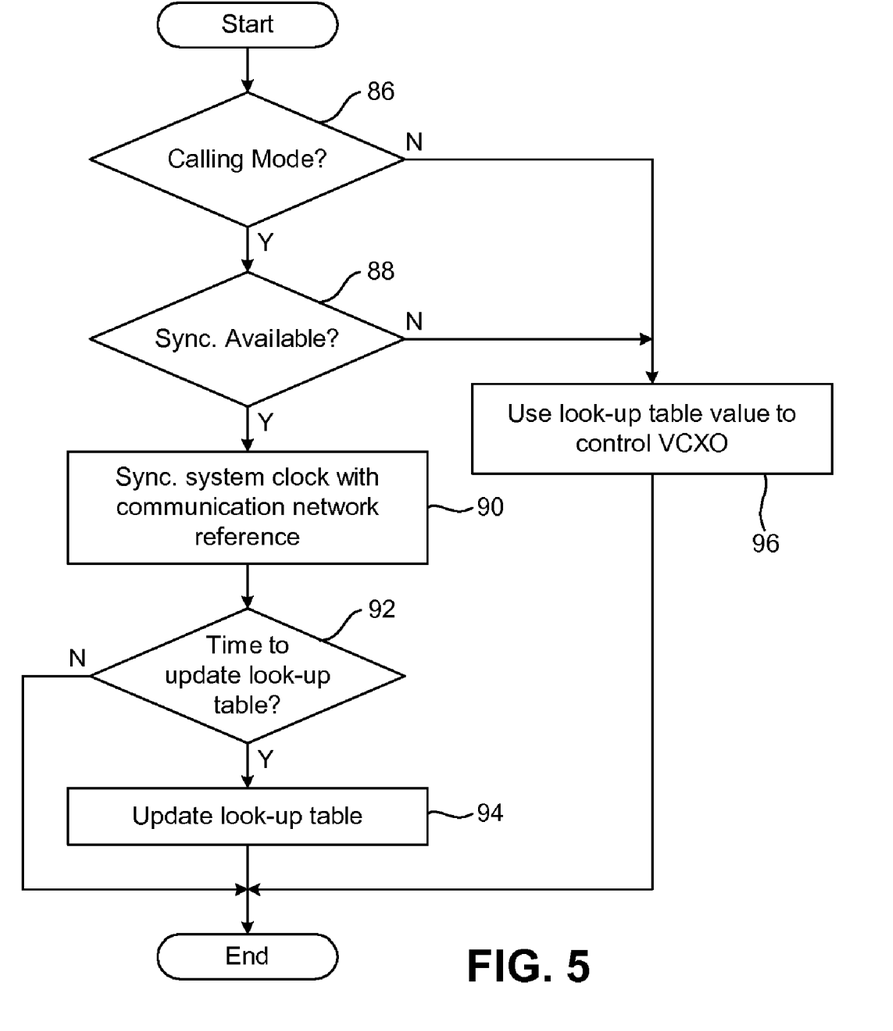
FIG. 5 is flow chart of an exemplary method of controlling the system clock in accordance with an embodiment of the present invention.

With additional reference to FIG. 5, illustrated is a flow chart of logical blocks that make up a system clock control function executed by the controller 62. The flow chart may be thought of as depicting steps of a method of maintaining accuracy of the system clock 52 even when synchronization of the system clock with the communications network 56 cannot be preformed and/or a method of maintaining accuracy of the system clock 52 to support an operational mode of the mobile telephone 10.

Although FIG. 5 shows a specific order of executing functional logic blocks, the order of execution of the blocks may be changed relative to the order shown. Also, two or more blocks shown in succession may be executed concurrently or with partial concurrence. Certain blocks also may be omitted. In addition, any number of commands, state variables, semaphores or messages may be added to the logical flow for purposes of enhanced utility, accounting, performance, measurement, troubleshooting, and the like. It is understood that all such variations are within the scope of the present invention.

The method may be carried out at any appropriate time during operation of the mobile telephone 10. Example times include at mobile telephone 10 start up, on a periodic basis as determined by a schedule or upon the occurrence of an event (e.g., a change in communications network 56 connectivity), upon entering an operational mode of the mobile telephone 10 (e.g., a mobile radio mode or mobile television mode, a wireless network interfacing mode, a location determination mode) and so on.

The method may begin in block 86 where a determination of whether the mobile telephone 10 is in a calling mode is made. The term calling mode is used to describe any mode or state of the mobile telephone 10 that allows communication with the communications network 56 by which synchronization of the system clock may be made. For instance, in a cellular-based communications network 56, the calling mode may be referred to as a cellular mode.

If a positive determination is made in block 86, the logical flow may proceed to block 88 where a determination of whether the system clock 52 may be synchronized with the communications network 56 is made. Techniques for system clock synchronization with the communications network 56 will be generally known to those of ordinary skill in the art and, for the sake of brevity, will not be described in detail herein. In one embodiment, synchronization is of the system clock 52 is made using a virtual channed link (VCL) between the mobile telephone 10 and the communications network 56. Through the VCL, the communications network 56 may monitor the system clock signal of the mobile telephone 10 for a frequency error relative to a communications network 56 reference clock. Based on the frequency error, the communications network 56 may coordinate with the controller 62 to adjust the digital control signal input to the voltage controller 68 to adjust the output frequency of the oscillator 70. In other embodiments, a clock reference signal that is contained in a baseband signal from the communications network 56 may be acquired by the mobile telephone 10 and the acquired signal may be used by the mobile telephone 10 to determine and correct any frequency error. Typically, the synchronization is conducted in conjunction with a base station (not shown) of the communications network 56 that is currently servicing the mobile telephone 10. Therefore, an example of when the clock synchronization operation is unavailable may be when the mobile telephone 10 is out of range of an appropriate base station.

If a positive determination is made in block 88, meaning that clock synchronization is available, the logical flow may proceed to block 90. In some embodiments, a negative determination may be made in block 88 even if synchronization is available. For instance, if the user of the mobile telephone 10 takes action to place the mobile telephone 10 in a certain operational mode where control of the system clock 52 without synchronization is desired, a negative determination may be made in block 88

In block 90, the system clock 52 of the mobile telephone 10 is synchronized with the communications network 56 reference clock. Synchronization may be carried out in any suitable manner, including the techniques described above.

Proceeding to block 92, a determination may be made as to whether the look-up table 66 should be updated. Updating of the look-up table 66 may be made on a periodic basis, such as each time synchronization of the system clock 52 with the communications network 56 is made, based on a time schedule (e.g., after a specified time has elapsed since the last look-up table update), or based on an event schedule (e.g., after a specified number of mobile telephone 10 start-ups have been made). If a negative determination is made in block 92, the logical flow may end.

If a positive determination is made in block 92, the logical flow may proceed to block 94 where the look-up table 66 is updated. The look-up table 66 may contain controller 62 digital control signal values for a variety of operating temperatures. In other embodiments, the look-up table 66 may contain tuning voltages for application to the oscillator input node 72 versus temperature.

To update the look-up table 66, the temperature at the time of synchronization may be detected by the temperature sensor 64. The temperature may be detected in physical association with the VCXO 60 so that the detected temperature is or is a close approximation to the operating temperature of the VCXO 60. The operating temperature of the VCXO 60 may differ from the ambient temperature of the environment in which the mobile telephone 10 operates due to heat generated by various electrical components of the mobile telephone 10, or due to transfer of heat from a user in situations where the user has been holding the mobile telephone 10 or had the mobile telephone 10 in a pocket. In another embodiment, the temperature sensor 64 may detect the ambient temperature of the environment in which the mobile telephone 10 operates as an approximation of the operating temperature of the VCXO 60. Once the temperature is detected, the digital control signal value in the look-up table 66 that is associated with the detected temperature can be updated to be the digital control signal value used to control the VCXO to generate the synchronized clock signal. Once the look-up table 66 is updated in block 94, the logical flow may end.

It will be appreciated that updating the look-up table 66 on a periodic basis may function to compensate for aging of the VCXO 60. In particular, the look-up table 66 is updated over time with controller 62 output values that have recently been used in conjunction with the synchronization process to generate a system clock signal of a desired frequency. Thus, the updated controller 62 output values stored in the look-up table 66 automatically compensate for aging of the VCXO 60.

If a negative determination is made in either of blocks 86 or 88 (e.g., meaning that system clock synchronization is not available by either an operational mode setting or actual network synchronization unavailability), the logical flow may proceed to block 96. The operations of block 96 are configured to establish an accurate system clock signal frequency, even if synchronization of the system clock 52 with the communications network 52 is not available. In block 96, the controller 62 obtains a temperature measurement from the temperature sensor 64. Using the temperature from the temperature sensor 64, the controller 62 obtains a corresponding output value from the look-up table 66. The obtained value from the look-up table 66 may be used as the output of the controller 62 that is input to the voltage controller 68 for frequency control of the oscillator 70. Following block 96, the logical flow may end.

As described above, an adaptive look-up table 66 is periodically updated when the system clock 52 is synchronized against a communications network 56. The look-up table 66 may contain system clock 52 tuning values (e.g., controller 62 output values or tuning voltage values) versus temperature values. The data from the look-up table may be used to adjust the output signal frequency of the system clock 52 when the system clock 52 is operated autonomously from the communications network 56. Updating the look-up table on a regular basis compensates for aging characteristics of the system clock 52. As indicated, the above-described method and apparatus may be used to generate a clock signal having an accurate frequency when the system clock 52 may not be synchronized with the communications network 56 or when a software application is enable that places the mobile telephone 10 in a particular operation mode, such as a mobile radio or mobile television mode, a wireless network interface mode, a location determining mode, a flight mode, etc.

It will be appreciated that the look-up table 66 may be replaced by a different type of database structure or by computational algorithms so that a controller 62 output value may be obtained or derived as a function of temperature and/or age of the VCXO 60. In these alternative embodiments, the updating of block 94 and the VCXO control of block 96 may be adapted in accordance with the alternative database structure or algorithmic approach.

It will be appreciated that the mobile telephone 10 may include multiple frequency generators. For example, baseband electronics may include a secondary frequency generator (not shown), such as a digital PLO, that maintains the clock signal while the mobile telephone 10 is in a sleep mode. When mobile telephone 10 wakes up from the sleep mode, the secondary frequency generator is disabled to enable the system clock 52 to function as a primary frequency generator and take over the responsibility of providing the desired frequency clock signal to the various components of the mobile telephone 10.

Although the invention has been shown and described with respect to certain preferred embodiments, it is understood that equivalents and modifications will occur to others skilled in the art upon the reading and understanding of the specification. The present invention includes all such equivalents and modifications, and is limited only by the scope of the following claims.

What is claimed is:

1. A mobile radio terminal, comprising:
    a system clock having a controller, a frequency generator for outputting a clock signal and a temperature sensor for detecting an operating temperature of the frequency generator, wherein the controller adjusts a frequency of the clock signal by inputting a frequency generator control value associated with the detected operating temperature to the frequency generator;
    a control circuit that manages overall operation of the mobile radio terminal, the control circuit configured to place the mobile radio in one of plural operational modes and the clock signal is used to clock an electrical component activated in connection with the one of the operational modes; and
    a look-up table that stores frequency generator control values for plural operating temperatures; and
    wherein the controller updates the look-up table in conjunction with a synchronization of the system clock with a reference signal from a communications network, the updating including changing a stored frequency generator control value for the operating temperature of the frequency generator at the time of synchronization to a control value applied to the frequency generator to establish synchronization of the system clock.

2. The mobile radio terminal of claim 1, wherein the frequency generator is a voltage controlled crystal oscillator (VCXO).

3. The mobile radio terminal of claim 2, wherein the frequency generator control value is input to a voltage controller of the frequency generator as a digital control signal and the voltage controller applies a corresponding analog voltage to a voltage control node of an oscillator of the frequency generator.

4. The mobile radio terminal of claim 2, wherein the frequency generator does not include a phase locked loop (PLL) circuit.

5. The mobile radio terminal of claim 1, further comprising a radio circuit clocked with the clock signal, the radio circuit configured to establish communications with the communications network.

6. The mobile radio terminal of claim 1, wherein the operational modes include at least one of a mobile television mode, a wireless network interface mode, a location determining mode or a mobile telephone flight mode.

7. A method of adjusting a frequency of a clock signal generated by a system clock of a mobile radio terminal, the system clock having a frequency generator, comprising:
    determining an operating temperature of the frequency generator;
    identifying a frequency generator control value associated with the determined temperature, wherein identifying the frequency generator control value associated with the determined temperature includes retrieving the frequency generator control value from a look-up table that stores frequency generator control values for plural operating temperatures;
    applying the control value to the frequency generator to control the frequency generator to output the clock signal with a target frequency;
    placing the mobile radio terminal in one of plural operational modes and clocking an electrical component activated in connection with the one of the operational modes with the clock signal;
    synchronizinci the system clock with a reference sicinal from a communications network; and
    in conjunction with the synchronizing, updating the look-up table by changing a stored frequency generator control value for the operating temperature of the frequency generator at the time of synchronization to a control value applied to the frequency generator to establish synchronization of the system clock.

8. The method of claim 7, wherein the frequency generator is a voltage controlled crystal oscillator (VCXO).

9. The method of claim 8, wherein the frequency generator control value is input to a voltage controller of the frequency generator as a digital control signal and the voltage controller applies a corresponding analog voltage to a voltage control node of an oscillator of the frequency generator.

10. The method of claim 8, wherein the frequency generator does not include a phase locked loop (PLL) circuit.

11. The method of claim 7, further comprising clocking at least one of a radio circuit or a control circuit of the mobile telephone with the clock signal.

12. The method of claim 7, wherein the operational modes include at least one of a mobile television mode, a wireless network interface mode, a location determining mode or a mobile telephone flight mode.

13. A method of adjusting a frequency of a clock signal generated by a system clock of a mobile radio terminal, the system clock having a frequency generator, comprising:
    determining if a synchronization function to synchronize the system clock with a reference signal provided by a communications network is available and, if so:
        synchronizing the system clock with the reference signal from the communications network; and
        updating a look-up table that stores frequency generator control values for plural operating temperatures of the frequency generator by changing a stored frequency generator control value for the operating temperature of the frequency generator at the time of synchronization to a control value applied to the frequency generator to establish synchronization of the system clock; else
    controlling the system clock by:
        determining an operating temperature of the frequency generator;

retrieving a previously stored frequency generator control value associated with the determined temperature from the look-up table; and applying the control value to the frequency generator to control the frequency generator to output the clock signal with a target frequency.

14. The method of claim 13, wherein the frequency generator is a voltage controlled crystal oscillator (VCXO).

15. The method of claim 14, wherein the frequency generator control value is input to a voltage controller of the frequency generator as a digital control signal and the voltage controller applies a corresponding analog voltage to a voltage control node of an oscillator of the frequency generator.

16. The method of claim 13, further comprising placing the mobile radio terminal in one of plural operational modes and clocking an electrical component activated in connection with the one of the operational modes with the clock signal.

* * * * *